United States Patent
Yamaguchi

(12) 
(10) Patent No.: US 6,570,425 B2
(45) Date of Patent: May 27, 2003

(54) PHASE DIFFERENCE SIGNAL GENERATOR AND MULTI-PHASE CLOCK SIGNAL GENERATOR HAVING PHASE INTERPOLATOR

(75) Inventor: Kouichi Yamaguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/985,556

(22) Filed: Nov. 5, 2001

(65) Prior Publication Data

US 2002/0053931 A1 May 9, 2002

(30) Foreign Application Priority Data

Nov. 6, 2000 (JP) ........................................ 2000-337057

(51) Int. Cl.[7] .............................................. H03H 11/26
(52) U.S. Cl. ....................................... 327/251; 327/258
(58) Field of Search ................................. 327/258, 239, 327/231, 256, 257, 252, 251

(56) References Cited

U.S. PATENT DOCUMENTS

| 6,111,445 A | * | 8/2000 | Zerbe et al. | 327/231 |
| 6,114,914 A | * | 9/2000 | Mar | 327/150 |
| 6,380,783 B1 | * | 4/2002 | Chao et al. | 327/258 |

FOREIGN PATENT DOCUMENTS

| JP | 57-34729 | 2/1982 |
| JP | 63-121307 | 5/1988 |
| JP | 10-171548 | 6/1998 |

OTHER PUBLICATIONS

M. Combes et al., "A Portable Multiplier Generator Using Digital CMOS Standard Cells," IEEE Journal of Solid–State Circuits 31:7, pp. 958–965 (Jul. 1996).

S. Sidiropoulos etl al., "A Semidigital Dual Delay–Locked Loop", IEEE Journal of Solid–State Circuits 32:11, pp. 1683–1692 (Nov. 1997).

* cited by examiner

*Primary Examiner*—Dinh T. Le
(74) *Attorney, Agent, or Firm*—Foley & Lardner

(57) ABSTRACT

In a phase difference signal generator, a first delay circuit has a delay time of nx where n ix 2, 3, . . . and x is a voluntary real number, the delay circuit receiving a first input clock signal having a phase of 0° to generate a first phase difference signal. At least one k-to-(n–k) weighted phase interpolator has a first input for receiving an output signal of said first delay circuit and a second input for receiving a second input clock signal having a phase of θ to generate an output signal having a phase of (n–k)x+kθ/n where k is 1, 2, . . . , n–1. At least one second delay circuit is connected to the k-to-(n–k) weighted phase interpolator. The second delay circuit has a delay time of kx to generate a k-th phase difference signal.

14 Claims, 15 Drawing Sheets

PHASE DIFFERENCE SIGNAL GENERATOR AND MULTI-PHASE CLOCK SIGNAL GENERATOR HAVING PHASE INTERPOLATOR

BACKGROUND OF THE INVENTION

1. Field of the Invention

The present invention relates to a phase difference signal generator and a multi-phase clock signal generator using the phase difference signal generator.

2. Description of the Related Art

Recently, integrated circuit devices have led to an increase in the clock frequency for the operation thereof. The maximum frequency of a clock signal generated by an oscillator is limited by the performance of the devices. In order to overcome this limitation of frequency, phase difference signal generators have been developed.

In a first prior art phase difference signal generator (see: Stefanos Sidiropoulos, "A Semidigital Dual Delay-Locked Loop", IEEE Journal of Solid-State Circuits, Vol. 32, No. 11, pp. 1683–1692, November 1997 & JP-A-10-171548), a delay line is constructed by delay elements connected in series. In this case, the delay time of the delay elements is definite and is adjusted by a delay line control unit. Thus, phase difference signals having a phase of, e.g. 30° different from each other are obtained. This will be explained later in detail.

In the above-described first prior art phase difference signal generator, however, a fine feedback control by the delay line control unit requires a complex circuit design, thus increasing the manufacturing cost. Also, the phase difference signal generator is large in size and has high power consumption.

In a second prior art phase difference signal generator (see: Japanese Utility Model Publication No. 57-34729), a carrier wave oscillator, D-type flip-flops and the like are provided. As a result, the carrier wave oscillator has a frequency twice that of the obtained phase difference signals. This will be explained later in detail.

In the above-described second prior art phase difference signal generator, however, the frequency of the phase difference signals is half of that of the carrier wave oscillator, which is a problem.

In a third prior art phase difference signal generator (see JP-A-63-121307), when a first distributor receives an input clock signal, the first distributor transmits it to a second distributor connected to an inverter and also transmits it via a delay circuit to a third distributor. A first adder adds an output signal of the second distributor to an output signal of the third distributor to generate a first phase difference signal. On the other hand, a second adder adds an output signal of the second distributor to an output signal of the third distributor to generate a second phase difference signal having a phase of 90° relative to the first phase difference signal. This also will be explained later in detail.

In the above-described third prior art phase difference signal generator, however, one of the first and second phase difference signals has a smaller amplitude, which would not operate a post stage circuit.

SUMMARY OF THE INVENTION

It is an object of the present invention to provide a phase difference signal generator which requires no complex feedback control, can generate larger frequency phase difference signals and can suppress the decrease of amplitude thereof.

Another object is to provide a multi-phase clock signal generator using such a phase difference signal generator.

According to the present invention, in a phase difference signal generator, a first delay circuit has a delay time of nx where n is 2, 3, . . . and x is a voluntary real number. The first delay circuit receives a first input clock signal having a phase of 0° to generate a first phase difference signal. At least one k-to-(n−k) weighted phase interpolator has a first input for receiving an output signal of the first delay circuit and a second input for receiving a second input clock signal having a phase of θ to generate an output signal having a phase of (n−k)x+kθ/n where k is 1, 2, . . . , n−1. At least one second delay circuit is connected to the k-to-(n−k) weighted phase interpolator. The second delay circuit has a delay time of kx to generate a k-th phase difference signal.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, prior art phase difference signal generators will be explained with reference to FIGS. 1, 2, 3A and 3B.

Figure 1:
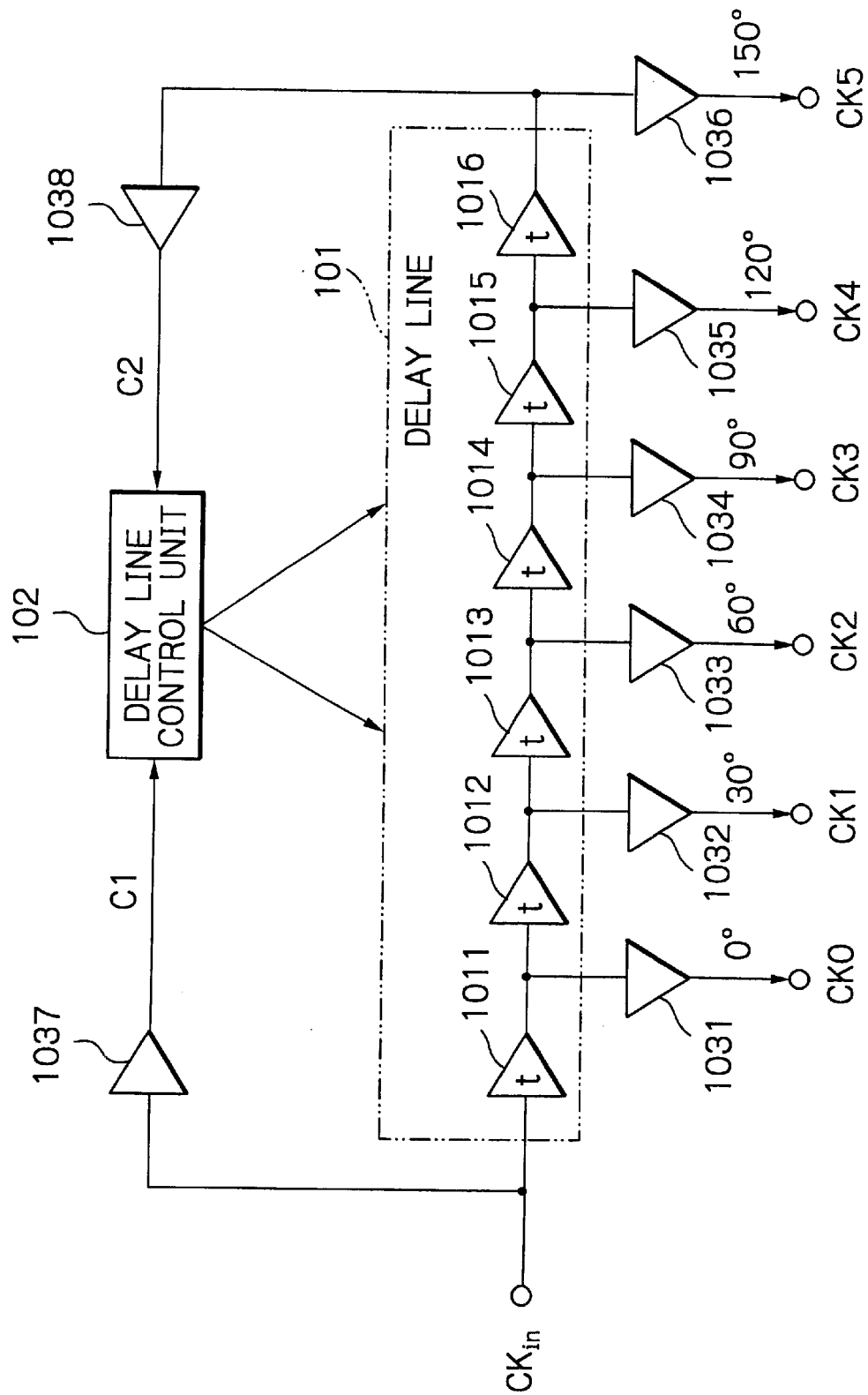
FIG. 1 is a circuit diagram illustrating a first prior art phase difference signal generator.

In FIG. 1, which illustrates a first prior art phase difference signal generator (see: Stefanos Sidiropoulos, "A Semi-digital Dual Delay-Locked Loop", IEEE Journal of Solid-State Circuits, Vol. 32, No. 11, pp. 1683–1692, November 1997 & JP-A-10-171548), six phase difference signals CK0, CK2, . . . , CK5 having a definite difference of 30° in phase are generated. In FIG. 1, a delay line 101 is constructed by delay elements 1011, 1012, 1013, 1014, 1015 and 1016 connected in series. In this case, the delay time t of the delay elements 1011, 1012, 1013, 1014, 1015 and 1016 is definite and is adjusted by a delay line control unit 102. Therefore, when the delay line 101 receives an input clock signal $CK_{in}$, the delay elements 1011, 1012, 1013, 1014, 1015 and 1016 generate phase difference signals CK0, CK2, CK3, CK4 and CK5, respectively, with a definite phase difference corresponding to the delay time t. In FIG. 1, reference numeral 1031, 1032, 1033, 1034, 1035, 1036, 1037 and 1038 designate buffers having the same characteristics.

In order to adjust the above-mentioned definite phase difference, the delay line control unit 102 receives a signal C1 depending on the input clock signal $CK_{in}$ from the buffer 1037 and a signal C2 depending on the phase difference signal CK5 from the buffer 1038. As a result, the delay line control unit 102 adjusts the delay time t of the delay elements 1011, 1012, 1013, 1014, 1015 and 1016, so that the difference in phase between the signals C1 and C2 is brought close to 180°. Thus, the phase difference signals CK0, CK1, CK2, CK3, CK4 and CK5 have a phase of 30° in difference with each other.

In the phase difference signal generator of FIG. 1, however, a fine feedback control by the delay line control unit 102 requires a complex circuit design, which would increase the manufacturing cost. Also, the phase difference-signal generator of FIG. 1 is large in size and power consumption.

Figure 2:
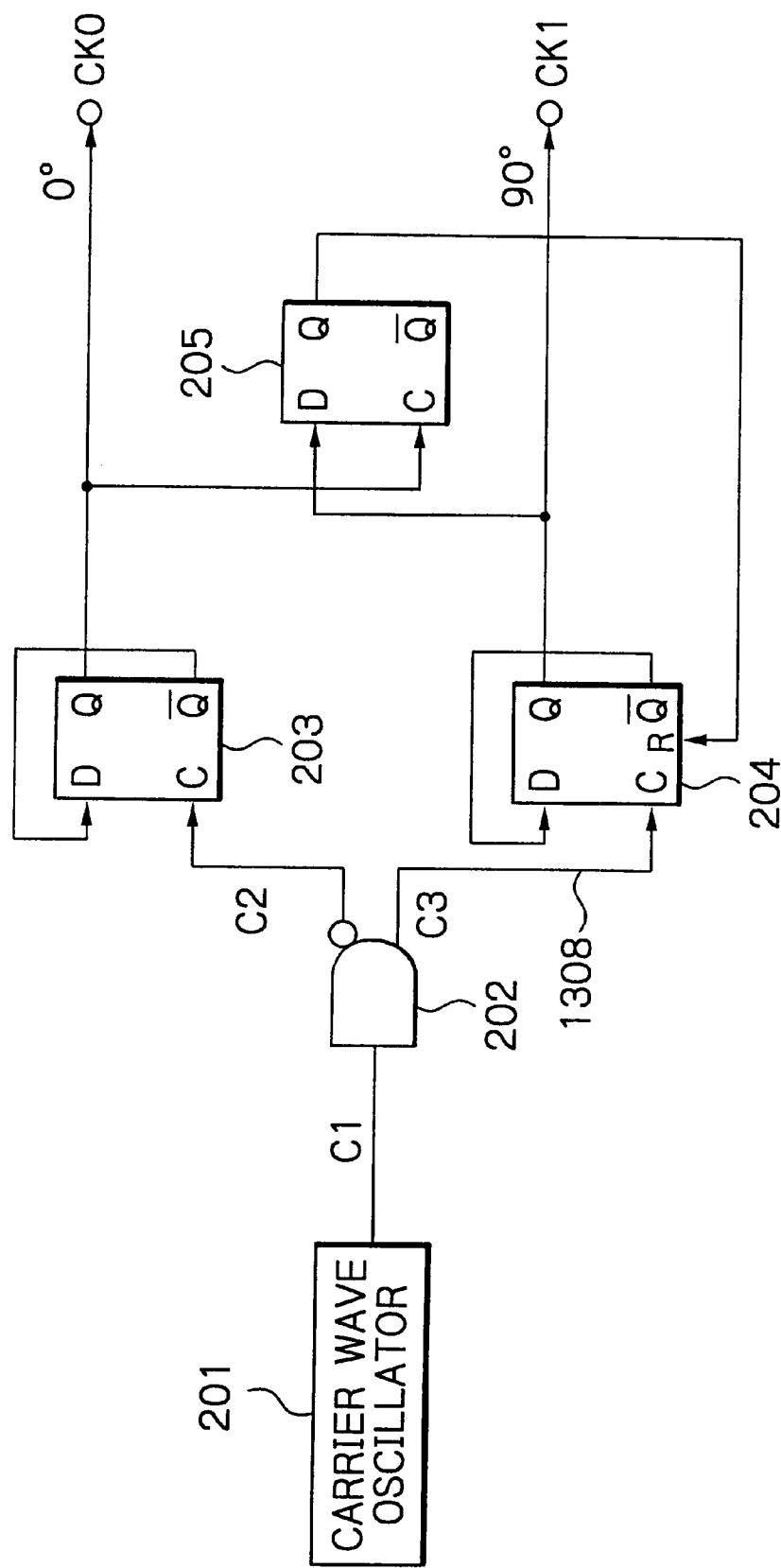
FIG. 2 is a circuit diagram illustrating a second prior art phase difference signal generator.

In FIG. 2, which illustrates a second prior art phase difference signal generator (see: Japanese Utility Model Publication No. 57-34729), phase difference signals CK0 and CK1 having a phase of 90° in difference are generated. In FIG. 2, a carrier wave oscillator 201 has a frequency twice that of the phase difference signals CK0 and CK1. The carrier wave oscillator 201 generates a carrier wave signal C1 and transmits it to a gate circuit 202 which generates signals C2 and C3 opposite in phase. A D-type flip-flop 203 serving as a frequency divider is clocked by a rising edge of the signal C2, so that the output state of the D-type flip-flop 203 is reversed to generate the phase difference signal CK0. On the other hand, a D-type flip-flop 204 serving as a frequency divider is clocked by a rising edge of the signal C3, so that the output state of the D-type flip-flop 204 is reversed to generate the phase difference signal CK1. In this case, a D-type flip-flop 205 is clocked by the signal CK0 to fetch the signal CK1 to generate a reset signal, thus resetting the D-type flip-flop 204. Therefore, the phase of the phase difference signal CK0 is always advanced as compared with that of the phase difference signal CK1. As a result, a definite relationship in phase between the phase difference signals CK0 and CK1 is established.

In the phase difference signal generator of FIG. 2, however, the frequency of the phase difference signals CK0 and CK1 is half of that of the carrier wave oscillator 201.

Figure 3A:
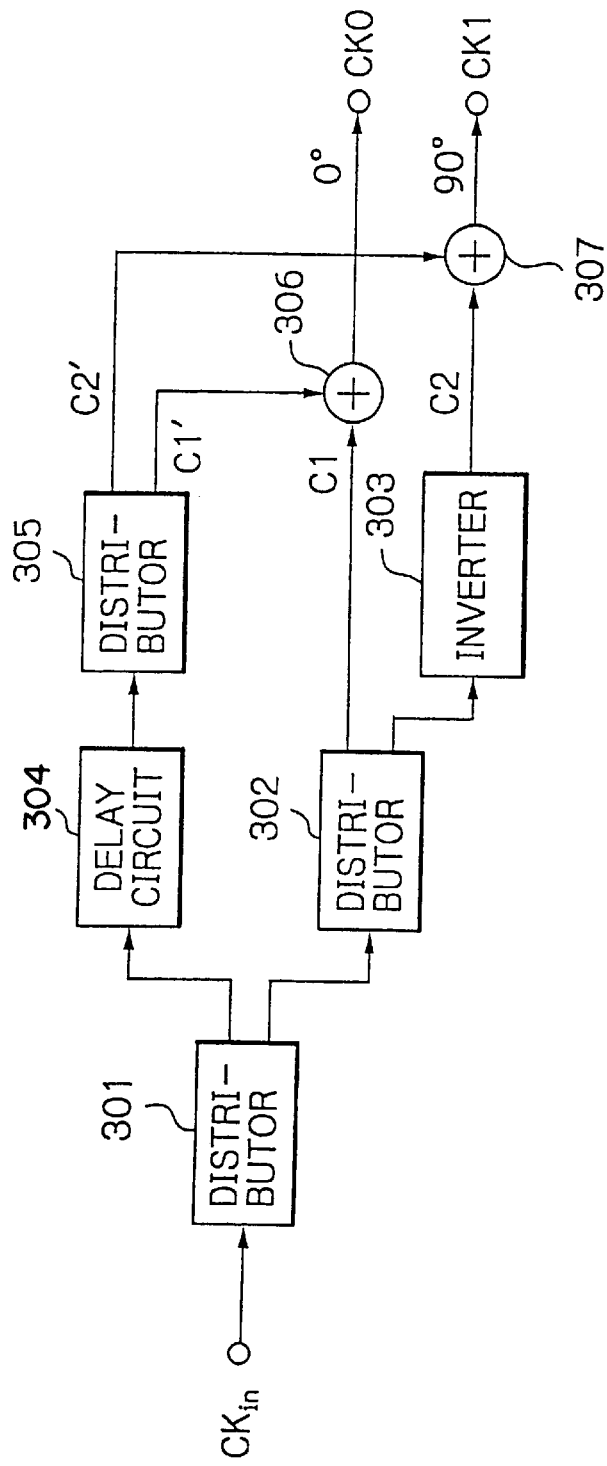
FIG. 3A is a circuit diagram illustrating a third prior art phase difference signal generator.

In FIG. 3A, which illustrates a third prior art phase difference signal generator (see JP-A-63-121307), phase difference signals CK0 and CK1 having a phase of 90° in difference are generated. In FIG. 3A, when a distributor 301 receives an input clock signal $CK_{in}$, the distributor 301 transmits it to a distributor 302 connected to an inverter 303 and also transmits it via a delay circuit 304 to a distributor 305. An adder 306 adds an output signal C1 of the distributor 302 to an output signal C1' of the distributor 305 to generate the phase difference signal CK0. On the other hand, an adder 307 adds an output signal C2 of the inverter 303 to an output signal C2' of the distributor 305 to generate the phase difference signal CK1.

Figure 3B:
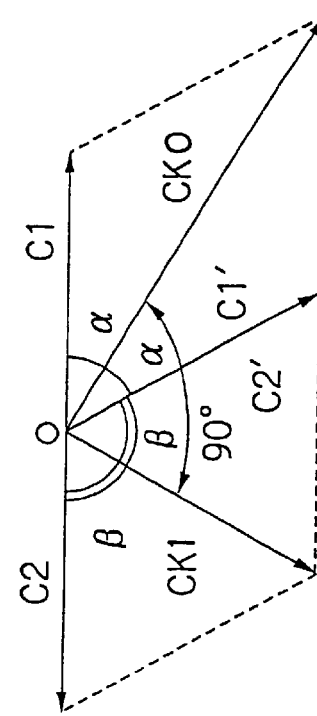
FIG. 3B is a vector diagram showing the operation of the phase difference signal generator of FIG. 3A.

As shown in FIG. 3B, the difference in phase between the output signals C1 and C2 is 180° due to the presence of the inverter 303. On the other hand, the difference in phase between the output signals C1' and C2' is 0°. Since the amplitudes of the output signals C1 and C1' are the same as each other, the phase of the phase difference signal CK0 is α with respect to the output signal C1. Also, since the amplitudes of the output signals C2 and C2' are the same as each other, the phase of the phase difference signal CK1 is 2α+β with respect to the output signal C1. Therefore, the difference in phase between the phase difference signals CK0 and CK2 is (2α+β)−α=α+β=90°.

In the phase difference signal generator of FIG. 3A, if α<90°, the amplitude of the phase difference signal CK1 is smaller than that of the phase difference signal CK0. On the other hand, if α>90°, the amplitude of the phase difference signal CK0 is smaller than that of the phase difference signal CK1. As a result, one of the phase difference signals CK0 and CK1 having a smaller amplitude would not operate a post stage circuit.

Figure 4:
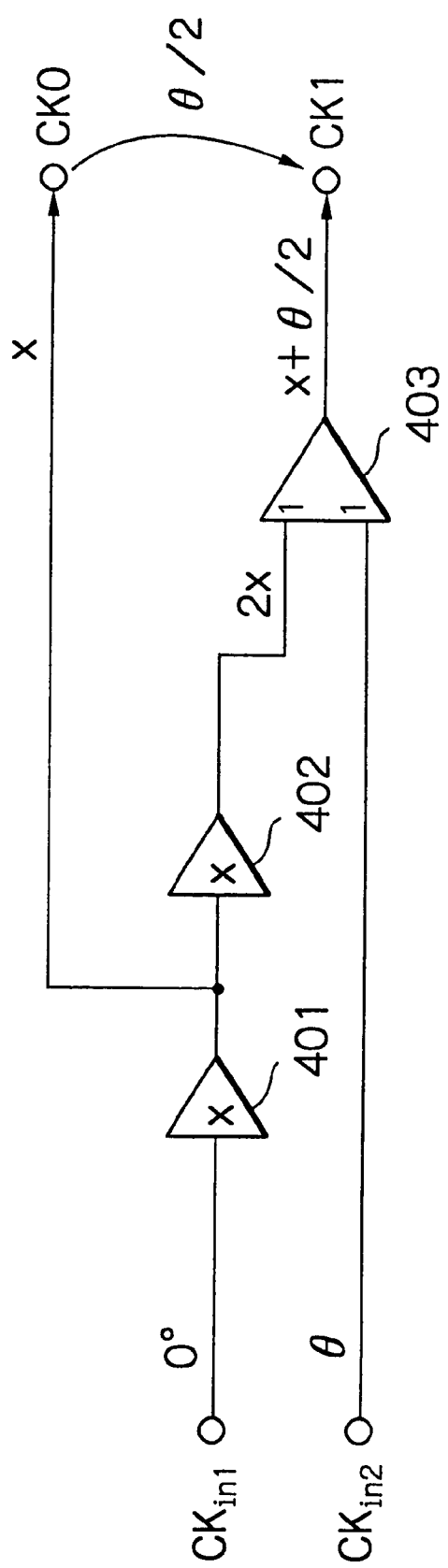
FIG. 4 is a circuit diagram illustrating a first embodiment of the phase difference signal generator according to the present invention.

In FIG. 4, which illustrates a first embodiment of the phase difference signal generator according to the present invention, reference numerals 401 and 402 designate delay circuits having a delay time x, and 403 designates a 1-to-1 weighted phase interpolator. An input clock signal $CK_{in1}$ having a phase of 0° is supplied to the delay circuits 401 and 402, so that a signal having a delay time of 2x is supplied to an input of the 1-to-1 weighted phase interpolator 403. On the other hand, an input clock signal $CK_{in2}$ having a phase of θ is supplied directly to another input of the 1-to-1 weighted phase interpolator 403.

A phase difference signal CK0 is obtained by an output signal of the delay circuit 401, so that the phase difference signal CK0 has a delay time of x.

Figure 5:
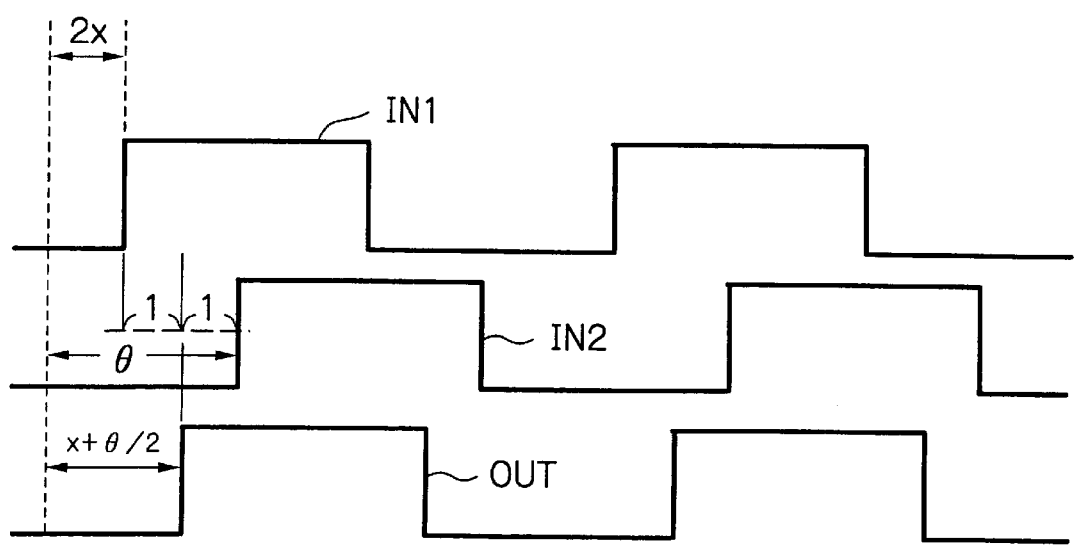
FIG. 5 is a timing diagram showing the operation of the 1-to-1 weighted phase interpolator of FIG. 4.

On the other hand, in the 1-to-1 weighted phase interpolator 403, an input signal IN1 having a delay time of 2x and an input signal IN2 having a phase of θ as shown in FIG. 5 are supplied, so that an output signal OUT as shown in FIG. 5 has a phase of:

(2x+θ)/2=x+θ/2

Therefore, a phase difference signal CK1 which is an output signal of the 1-to-1 weighted phase interpolator 403 has a phase of x+θ/2.

Thus, the difference in phase between the phase difference signals CK0 and CK1 is θ/2 regardless of the delay time x of the delay circuits 401 and 402.

Figure 6:
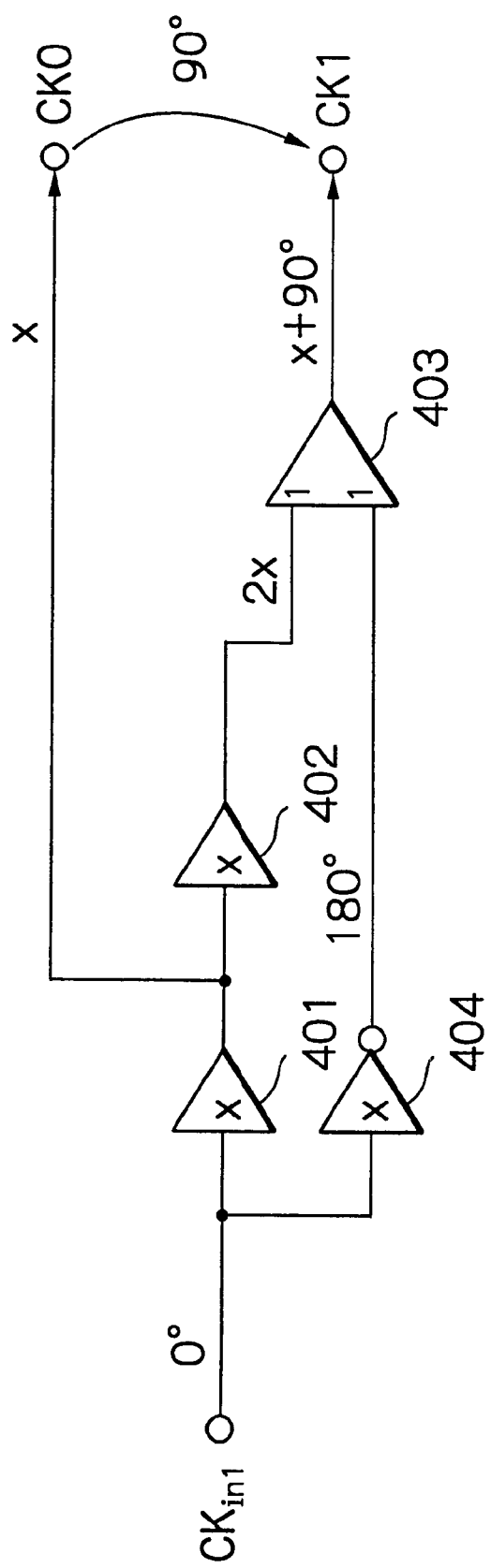
FIG. 6 is a circuit illustrating a modification of the phase difference signal generator of FIG. 4.

In FIG. 6, which illustrates a modification of the phase difference signal generator of FIG. 4, an inverter 404 is added thereto, so that an inverted signal of the input clock signal $CK_{in1}$ having a phase of 180° is supplied to the 1-to-1 weighted phase interpolator 403 without using the input clock signal $CK_{in2}$. In this case, the difference in phase between the phase difference signals CK0 and CK1 is 90° regardless of the delay time x of the delay circuits 401 and 402.

Figure 7:
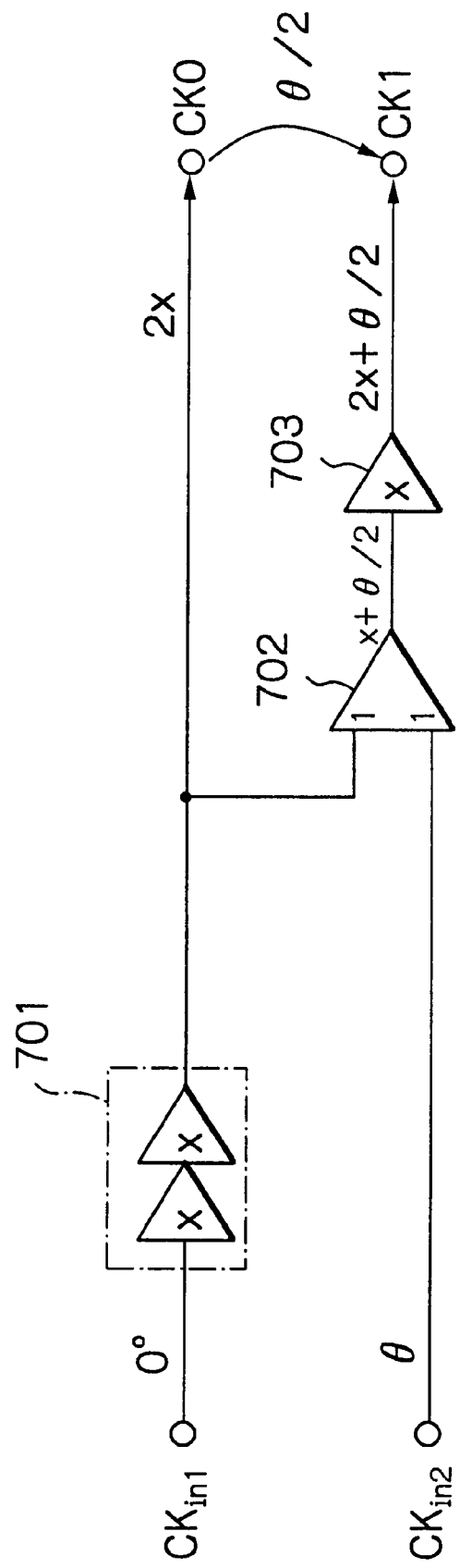
FIG. 7 is a circuit diagram illustrating a second embodiment of the phase difference signal generator according to the present invention.

In FIG. 7, which illustrates a second embodiment of the phase difference signal generator according to the present invention, reference numeral 701 designates a delay circuit having a delay time of 2x, 702 designates a 1-to-1 weighted phase interpolator, and 703 designates a delay circuit having a delay time of x. An input clock signal $CK_{in1}$ having a phase of 0° is supplied to the delay circuit 701, so that a signal having a delay time of 2x is supplied to an input of the 1-to-1 weighted phase interpolator 702. On the other hand, an input clock signal $CK_{in2}$ having a phase of θ is supplied directly to another input of the 1-to-1 weighted phase interpolator 702.

A phase difference signal CK0 is an output signal of the delay circuit 701, so that the phase difference signal CK0 has a delay time of 2x.

On the other hand, in the 1-to-1 weighted phase interpolator 702, an input signal having a delay time of 2x and an input signal having a phase of θ are supplied, so that an output signal has a phase of:

$$(2x+\theta)/2 = x + \theta/2$$

Therefore, a phase difference signal CK1 which is an output signal of the delay circuit 703 has a phase of $x+\theta/2+x=2x+\theta/2$.

Thus, the difference in phase between the phase difference signals CK0 and CK1 is θ/2 regardless of the delay time x of the delay circuit 701.

Figure 8:
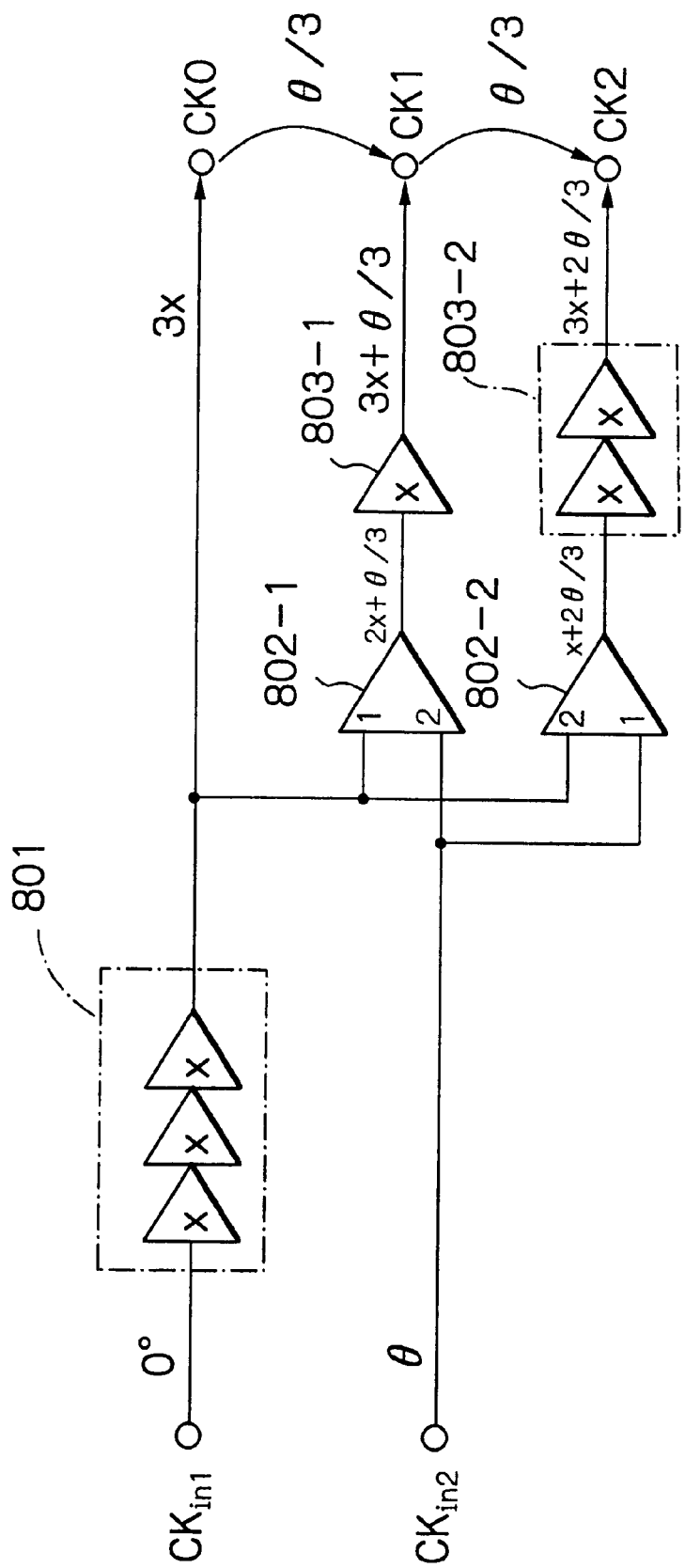
FIG. 8 is a circuit diagram illustrating a third embodiment of the phase difference signal generator according to the present invention.

In FIG. 8, which illustrates a third embodiment of the phase difference signal generator according to the present invention, reference numeral 801 designates a delay circuit having a delay time of 3x, 802-1 designates a 1-to-2 weighted phase interpolator, 802-2 designates a 2-to-1 weighted phase interpolator, 803-1 designates a delay circuit having a delay time of x, and 803-2 designates a delay circuit having a delay time of 2x. An input clock signal $CK_{in1}$ having a phase of 0° is supplied to the delay circuit 801, so that a signal having a delay time of 3x is supplied to a 1-weighted input of the 1-to-2 weighted phase interpolator 802-1 and a 2-weighted input of the 2-to-1 weighted phase interpolator 802-2. On the other hand, an input clock signal $CK_{in2}$ having a phase of θ is supplied directly to a 2-weighted input of the 1-to-2 weighted phase interpolator 802-1 and a 1-weighted input of the 2-to-1 weighted phase interpolator 803-2.

A phase difference signal CK0 is an output signal of the delay circuit 801, so that the phase difference signal CK0 has a delay time of 3x.

Figure 9A:
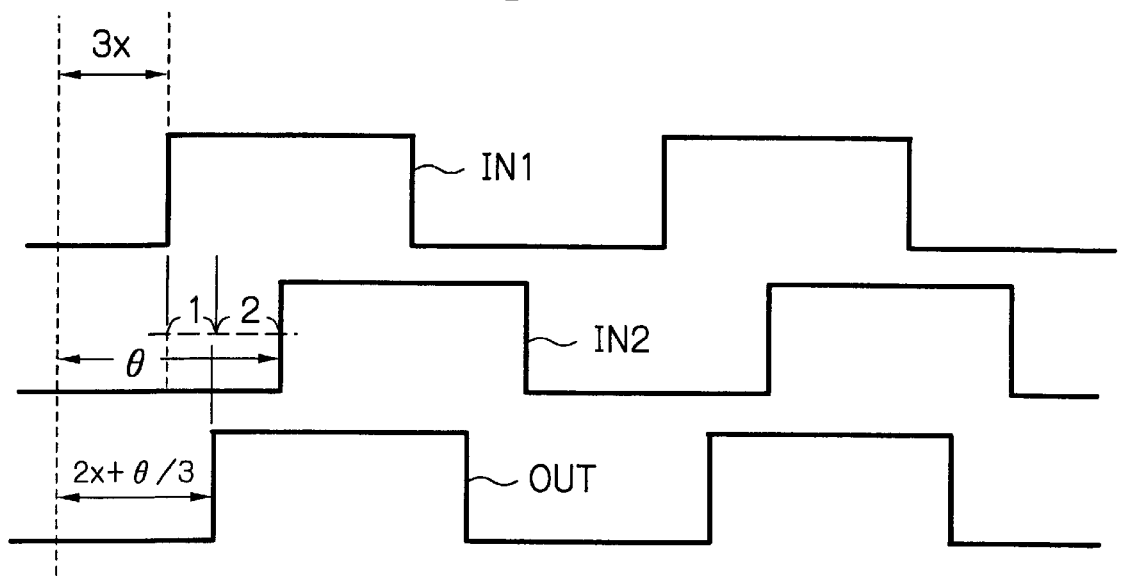
FIG. 9A is a timing diagram showing the operation of the 1-to-2 weighted phase interpolator of FIG. 8.

Also, in the 1-to-2 weighted phase interpolator 802-1, an input signal IN1 having a delay time of 3x and an input signal IN2 having a phase of θ as shown in FIG. 9A are supplied to the 1-weighted and 2-weighted inputs, respectively, so that an output signal OUT as shown in FIG. 9A has a phase of:

$$(2 \cdot 3x + 1 \cdot \theta)/3 = 2x + \theta/3$$

Therefore, a phase difference signal CK1 which is an output signal of the delay circuit 803-1 has a phase of $2x+\theta/3+x=3x+\theta/3$.

Thus, the difference in phase between the phase difference signals CK0 and CK1 is θ/3 regardless of the delay time x of the delay circuit 801.

Figure 9B:
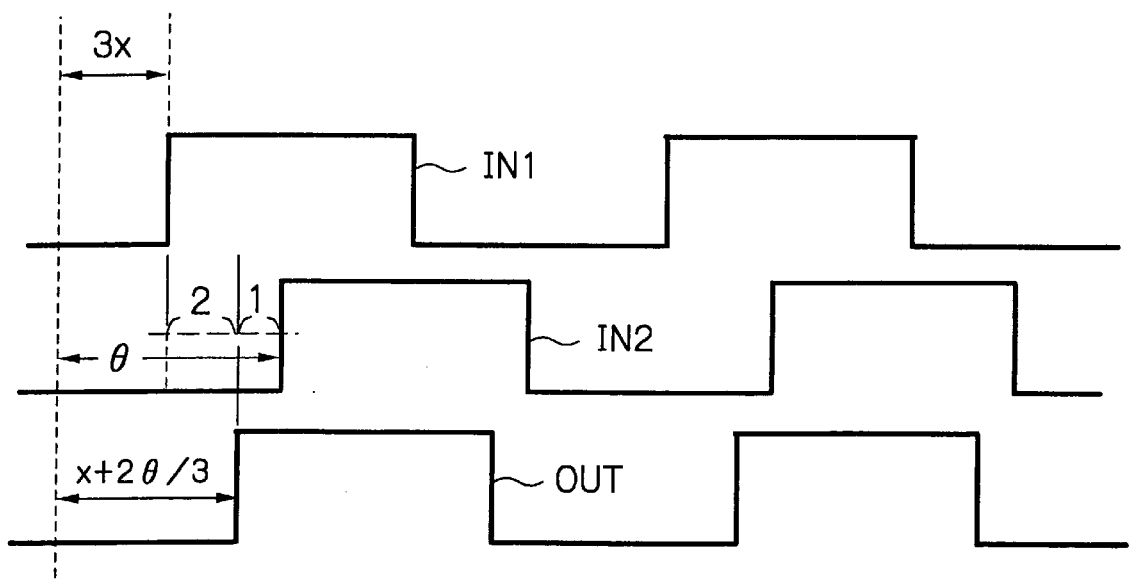
FIG. 9B is a timing diagram showing the operation of the 2-to-1 weighted phase interpolator of FIG. 8.

Further, in the 2-to-1 weighted phase interpolator 802-2, an input signal IN1 having a delay time of 3x and an input signal IN2 having a phase of θ as shown in FIG. 9B are supplied to the 2-weighted and 1-weighted inputs, respectively, so that an output signal OUT as shown in FIG. 9B has a phase of:

$$(3x + 2 \cdot \theta)/3 = x + 2\theta/3$$

Therefore, a phase difference signal CK2 which is an output signal of the delay circuit 803-2 has a phase of $x+2\theta/3+2x=3x+2\theta/3$.

Thus, the difference in phase between the phase difference signals CK1 and CK2 is θ/3 regardless of the delay time x of the delay circuit 801.

Figure 10:
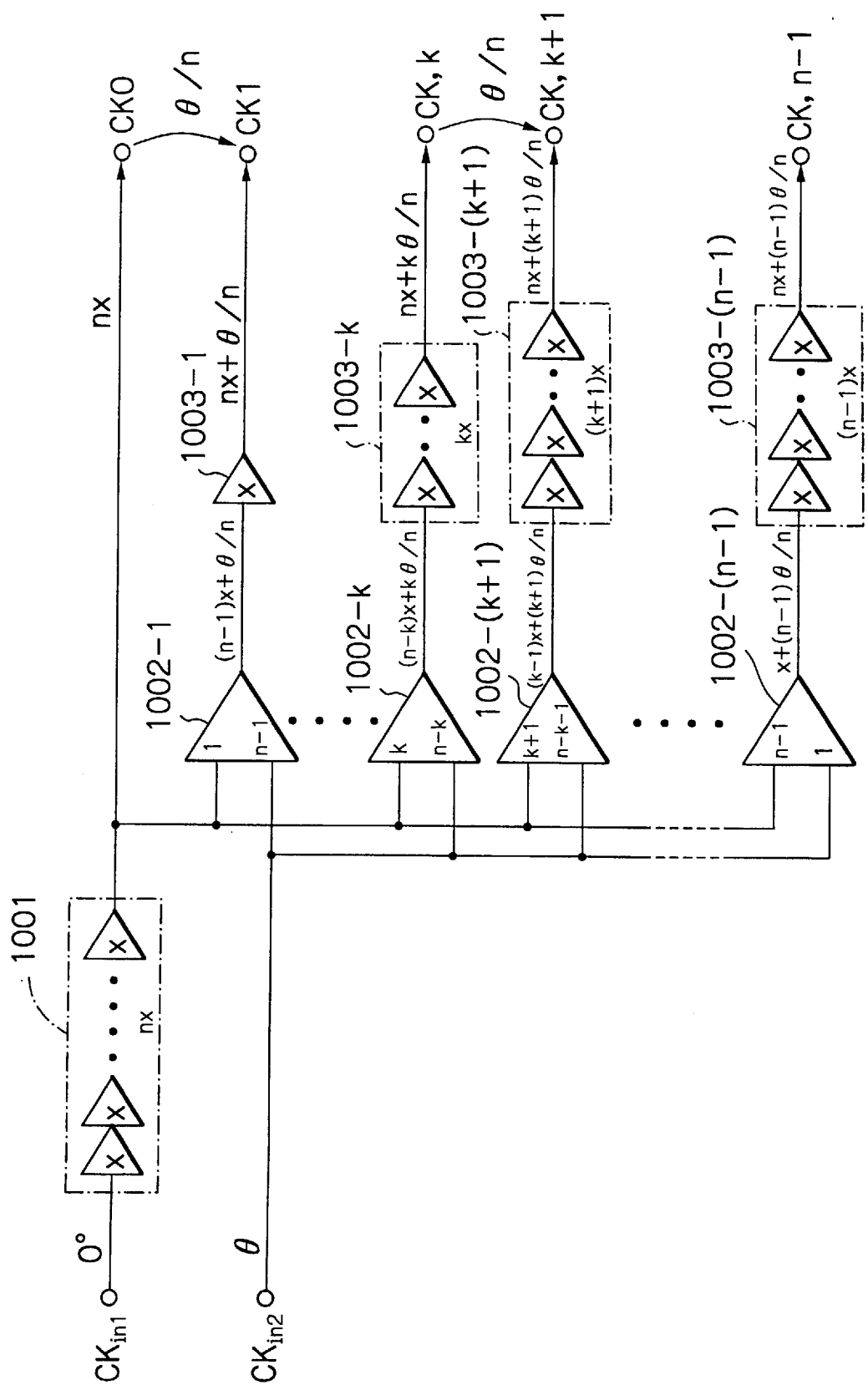
FIG. 10 is a circuit diagram illustrating a fourth embodiment of the phase difference signal generator according to the present invention.

In FIG. 10, which illustrates a fourth embodiment of the phase difference signal generator according to the present invention, the phase difference signal generators of FIGS. 7 and 8 are generalized, to generate phase difference signals CK0, CK1, . . . , CKk, CK,k+1, . . . , CK,n−1 having a phase difference of θ/n where n is 2, 3, 4, . . . . Note that if n=2, the phase difference signal generator of FIG. 10 is the same as the phase difference signal generator of FIG. 7, and if n=3, the phase difference signal generator of FIG. 10 is the same as the phase difference signal generator of FIG. 8.

In FIG. 10, reference numeral 1001 designates a delay circuit having a delay time of nx. Also, reference numeral 1002-1 designates a 1-to-(n−1) weighted phase interpolator, . . . , 1002-k designates a k-to-(n−k) weighted phase interpolator, 1002-(k+1) designates a (k+1)-to-(n−k−1) weighted phase interpolator, . . . , and 1002-(n−1) designates a (n−1)-to-1 weighted phase interpolator. Further, reference numeral 1003-1 designates a delay circuit having a delay time of x, . . . , 1003-k designates a delay circuit having a delay time of kx, 1003-(k+1) designates a delay circuit having a delay time of (k+1)x, . . . , and 1003-(n−1) designates a delay circuit having a delay time of (n−1)x.

An input clock signal $CK_{in1}$ having a phase of 0° is supplied to the delay circuit 1001, so that a signal having a delay time of nx is supplied to a 1-weighted input of the 1-to-(n−1) weighted phase interpolator 1002-1, . . . , a k-weighted input of the k-to-(n−k) weighted phase interpolator 1002-k, a (k+1)-weighted input of the (k+1)-to-(n−k−1) weighted phase interpolator 1002-(k+1), . . . , and a (n−1)-weighted input of the (n−1)-to-1 weighted phase interpolator 1002-(n−1).

On the other hand, an input clock signal $CK_{in2}$ having a phase of θ is supplied directly to a (n−1)-weighted input of the 1-to-(n−1) weighted phase interpolator 1002-1, . . . , a (n−k)-weighted input of the k-to-(n−k) weighted phase interpolator 1002-k, a (n−k−1)-weighted input of the (k+1)-to-(n−k−1) weighted phase interpolator 1002-(k+1), . . . , and a 1-weighted input of the (n−1)-to-1 weighted phase interpolator 1002-(n−1).

A phase difference signal CK0 is an output signal of the delay circuit 1001, so that the phase difference signal CK0 has a delay time of nx.

Also, the 1-to-(n−1) weighted phase interpolator 1002-1 generates an output signal having a phase of:

$$((n-1) \cdot nx + 1 \cdot \theta)/n = (n-1)x + \theta/n$$

Therefore, a phase difference signal CK1 which is an output signal of the delay circuit 1003-1 has a phase of:

$$(n-1)x + \theta/n + x = nx + \theta/n$$

Thus, the difference in phase between the phase difference signals CK0 and CK1 is θ/n regardless of the delay time x.

On the other hand, the k-to-(n−k) weighted phase interpolator 1002-k generates an output signal having a phase of:

$$((n-k) \cdot nx + k \cdot \theta)/n = (n-k)x + k\theta/n$$

Therefore, a phase difference signal CKk which is an output signal of the delay circuit 1003-k has a phase of:

$$(n-k)x + k\theta/n + kx = nx + k\theta/n$$

Also, the k-to-(n−k) weighted phase interpolator 1002-k generates an output signal having a phase of:

$$((n-k-1)\cdot nx+(k+1)\cdot \theta)/n=(n-k-1)x+(k+1)\theta/n$$

Therefore, a phase difference signal CK,k+1 which is an output signal of the delay circuit 1003-(k+1) has a phase of:

$$(n-k-1)x+(k+1)\theta/n+(k+1)x=nx+(k+1)\theta/n$$

Thus, the difference in phase between the phase difference signals CKk and CK,k+1 is θ/n regardless of the delay time x.

Therefore, in the phase difference signal generator of FIG. 10, the phase difference signals CK0, CK1, . . . , CK,k, CK,k+1, . . . , CK,n−1 have a phase difference θ/n with each other regardless of the delay time x.

Figure 11:
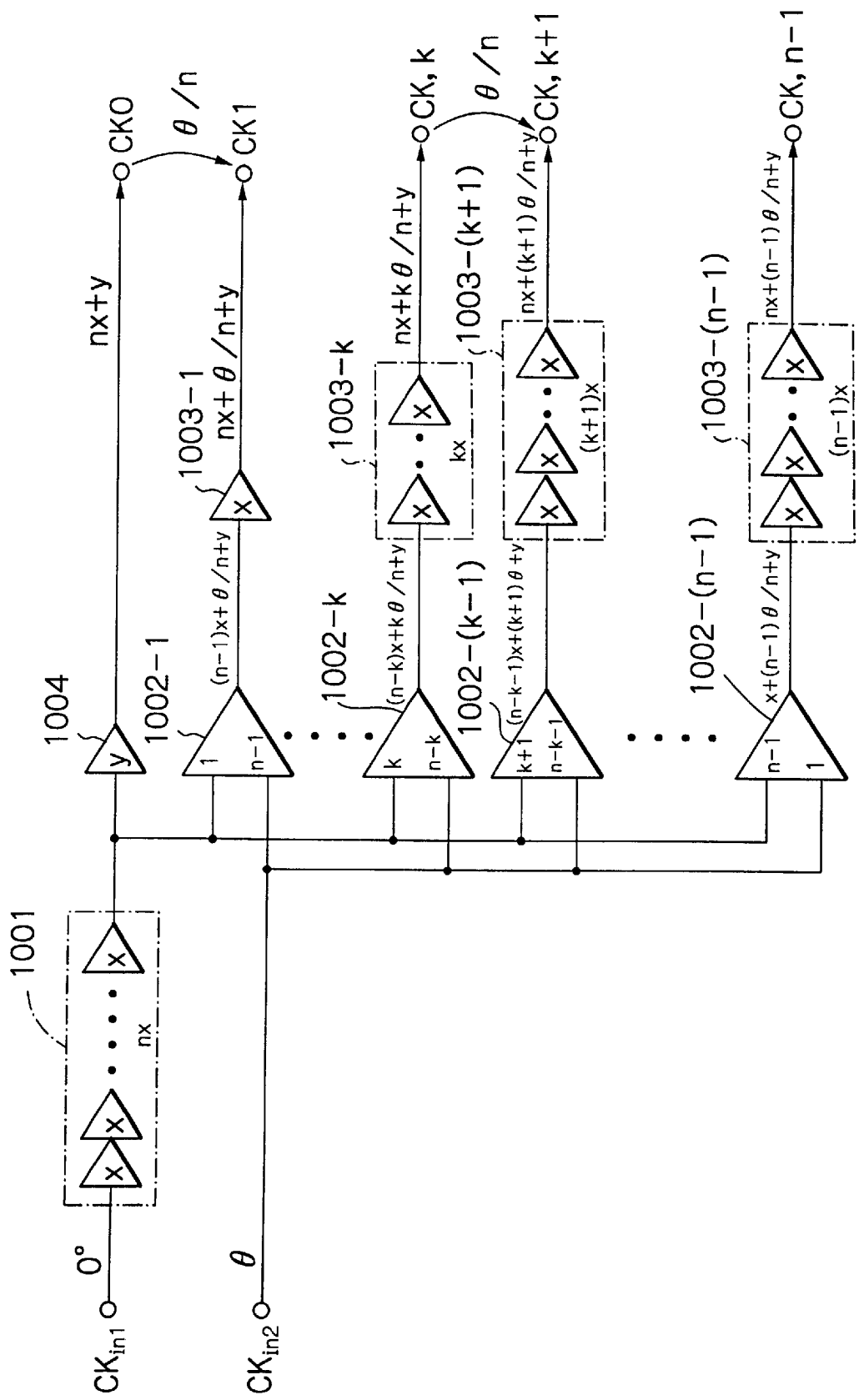
FIG. 11 is a circuit diagram illustrating a modification of the phase difference signal generator of FIG. 10.

In the phase difference signal generators of FIGS. 4, 6, 7, 8 and 9, if the phase interpolators have a delay time of y which cannot be negligible, a delay circuit having the delay time of y can be provided to delay the phase difference signal CK0. For example, in FIG. 11, which is a modification of the phase difference signal generator of FIG. 10, a delay circuit 1004 having the delay time y is added. In this case, since all the phase difference signals CK0, CK1, . . . , CK,k, CK,k+1, . . . , CK,n−1 have the delay time y, the phase difference signals CK0, CK1, . . . , CK,k, CK,k+1, . . . , CK,n−1 have a phase of θ/n regardless of the delay times x and y.

Multi-phase clock signal generators using the phase difference signal generator of FIG. 4 or 7 will be explained next with reference to FIGS. 12, 13 and 14.

Figure 12:
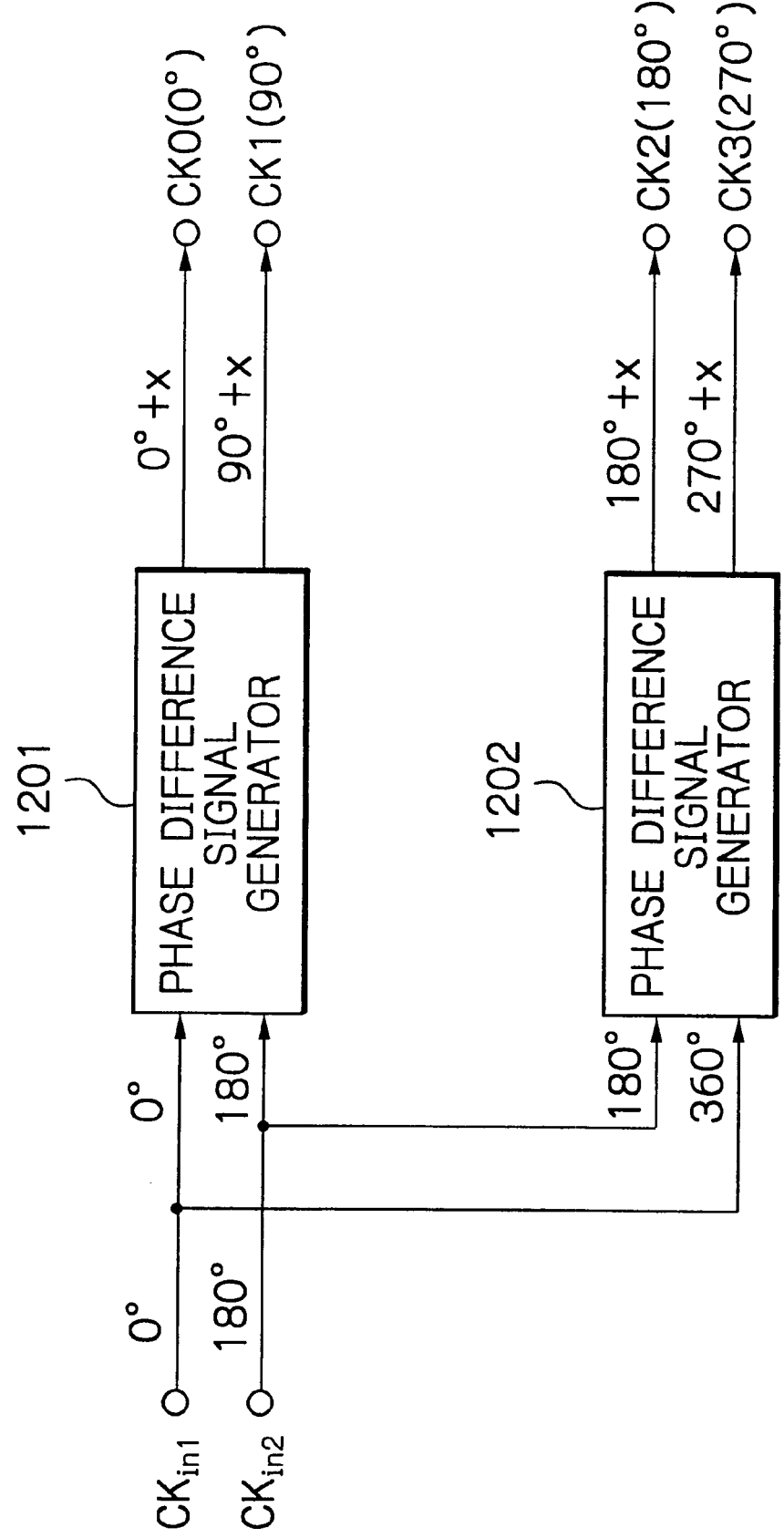
FIGS. 12, 13 and 14 are block circuit diagrams illustrating multi-phase clock signal generators to which the phase difference signal generators according to the present All invention are applied.

In FIG. 12, a multi-phase clock signal generator is constructed by two phase difference signal generators 1201 and 1202 each having the same configuration as the phase difference signal generator of FIG. 4 or 7.

In the phase difference signal generator 1201, input clock signals $CK_{in1}$ and $CK_{in2}$ having phases of 0° and 180° respectively, are supplied to the phase difference signal generators 1201 and 1202. In this case, the clock signals $CK_{in1}$ and $CK_{in2}$ are supplied to first and second inputs, respectively, of the phase signal generator 1201, so as to generate a clock signal CK0 having a phase of 0°+x and a clock signal CK1 having a phase of:

$$0°+(180°-0°)/2+x=90°+x$$

On the other hand, the clock signals $CK_{in2}$ and $CK_{in1}$ are supplied to first and second inputs. respectively, of the phase signal generator 1202, so as to generate a clock signal CK0 having a phase of 180°+x and a clock signal CK1 having a phase of:

$$180°+(360°-180°)/2+x=270°+x$$

Thus, the clock signals CK0, CK1, CK2 and CK3 have relative phase of 0°, 90°, 180° and 270°, respectively.

Figure 13:
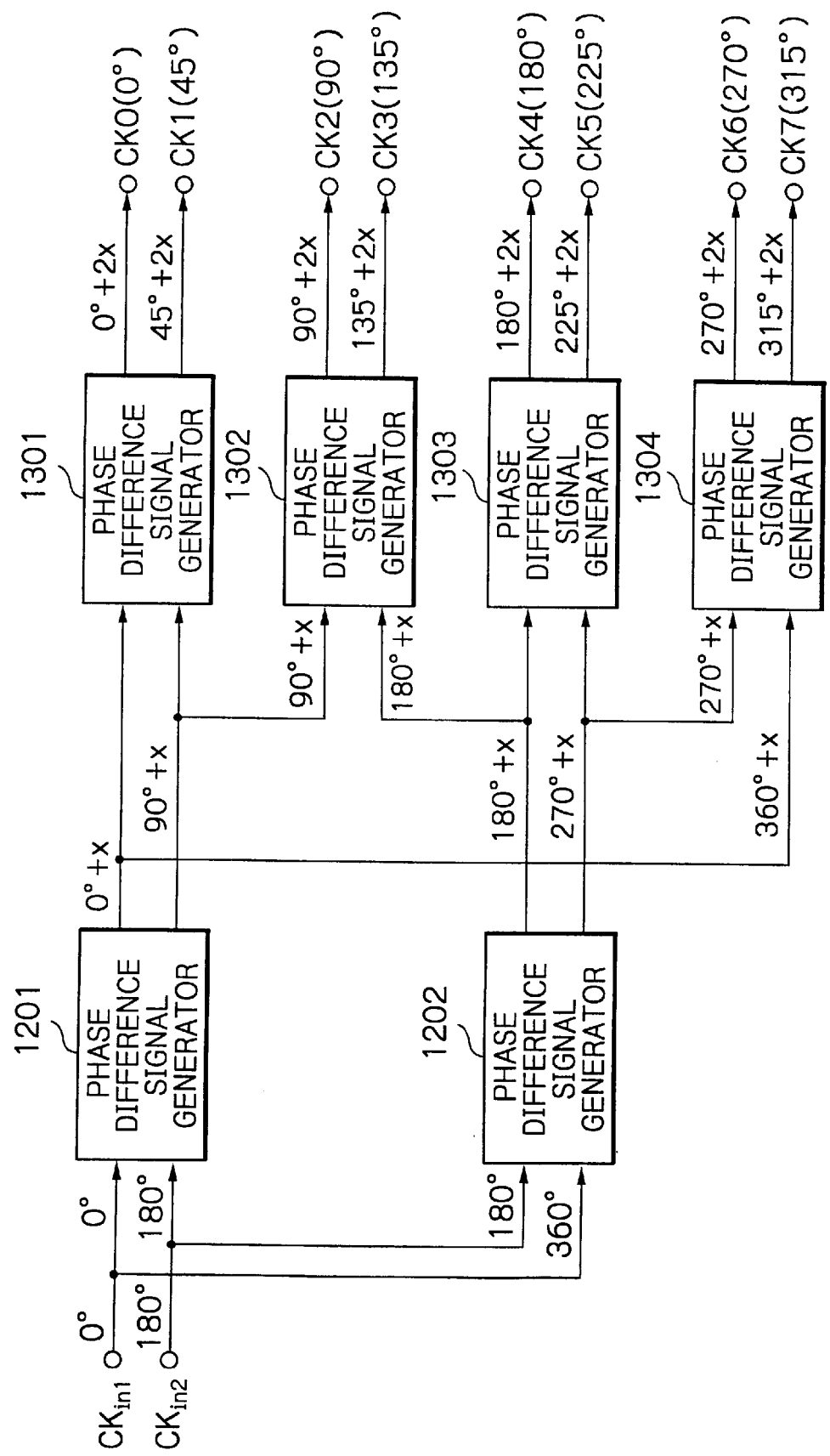

In FIG. 13, a multi-phase clock signal generator is constructed by four phase difference signal generators 1301, 1302, 1303 and 1304 each having the same configuration as the phase difference signal generator of FIG. 4 or 7 in addition to the phase difference signal generator of FIG. 12.

In the phase difference signal generator 1301, input signals having phases of 0°+x and 90°+x, respectively, are supplied to first and second inputs, respectively, of the phase difference signal generator 1301, so as to generate a clock signal CK0 having a phase of 0°+2x and a clock signal CK1 having a phase of:

$$0°+x+90°/2+x=45°+2x$$

In the phase difference signal generator 1302, input signals having phases of 90°+x and 180°+x, respectively, are supplied to first and second inputs, respectively, of the phase difference signal generator 1302, so as to generate a clock signal CK2 having a phase of 90°+2x and a clock signal CK3 having a phase of:

$$90°+x+90°/2+x=135°+2x$$

In the phase difference signal generator 1303, input signals having phases of 180°+x and 270°+x, respectively, are supplied to first and second inputs, respectively, of the phase difference signal generator 1303, so as to generate a clock signal CK4 having a phase of 180°+2x and a clock signal CK5 having a phase of:

$$180°+x+90°/2+x=225°+2x$$

In the phase difference signal generator 1304, input signals having phases of 270°+x and 360°+x, respectively, are supplied to first and second inputs, respectively, of the phase difference signal generator 1304, so as to generate a clock signal CK6 having a phase of 270°+2x and a clock signal CK7 having a phase of:

$$270°+x+90°/2+x=315°+2x$$

Thus, the clock signals CK0, CK1, CK2, CK3, CK4, CK5, CK6 and have relative phases of 0°, 45°, 90°, 135°, 180°, 225°, 270° and 315°, respectively.

Figure 14:
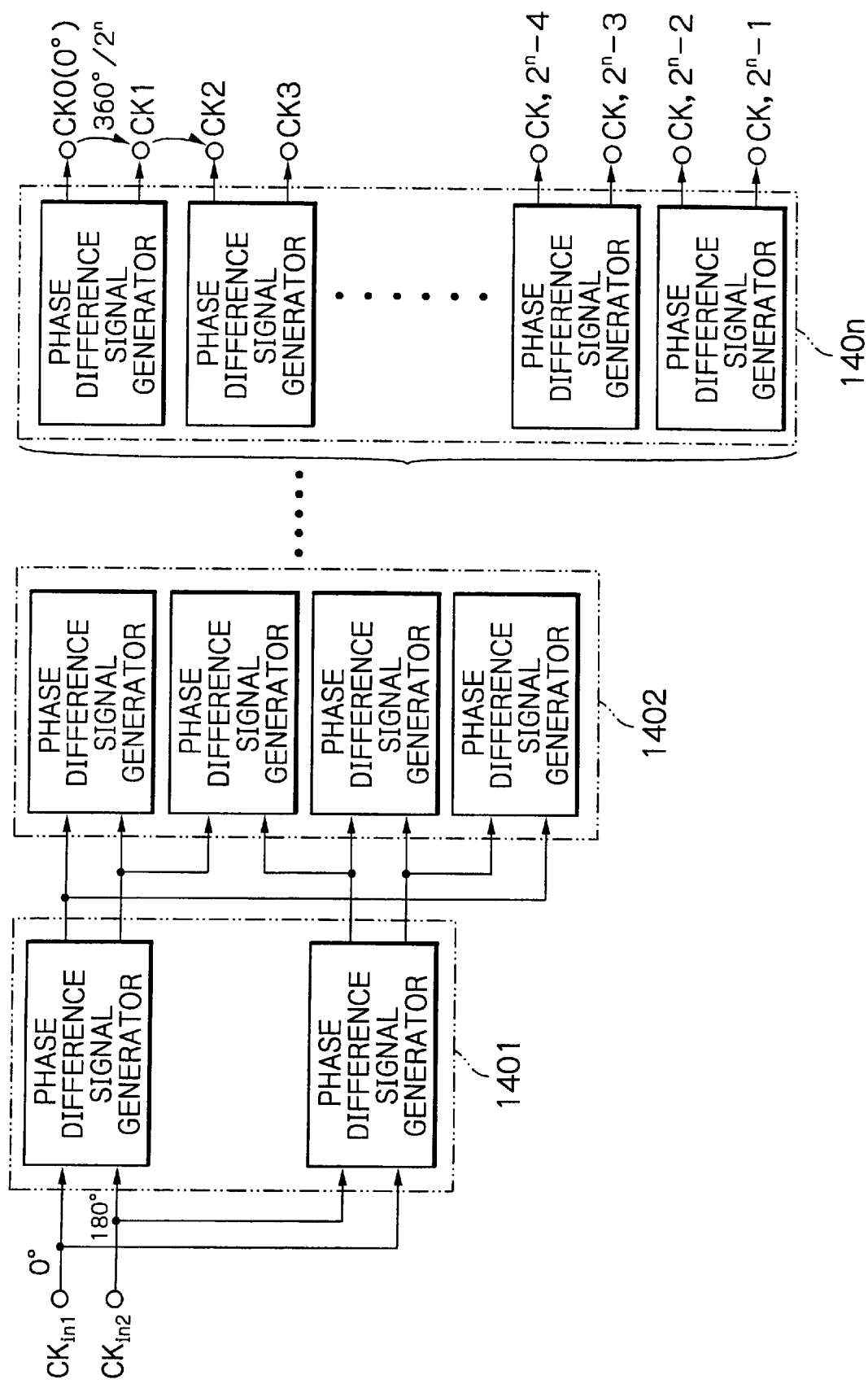

In FIG. 14, the multi-phase clock signal generators of FIGS. 12 and 13 are generalized to generate clock signals CK0, CK1, CK2, CK3, . . . , CK, $2^n-4$, CK, $2^n-3$, CK, $2^n-2$ and CK, $2^n-1$ having a phase difference of $360°/2^n$ where n is 1, 2, . . . . If n=1, the multi-phase clock signal generator of FIG. 14 is the same as the multi-phase clock signal generator of FIG. 12, and if n=2, the multi-phase clock signal generator of FIG. 14 is the same as the multi-phase clock signal generator of FIG. 13. That is, a first stage 1401 of phase difference signal generators generate four-phase clock signals CK0(0°), CK1(90°), CK2(180°) and CK3 (270°), and a second stage 1402 of phase difference signal generators generate eight-phase clock signals CK0(0°), CK1 (45°), . . . , and CK7(315°). Also, an n-th stage 140n of difference signal generators generate $2^n$-phase clock signals CK0(0°), CK1($360°/2^n$), . . . , and CK, $2^{n-1}(360°-360°/2^n)$.

Figure 15:
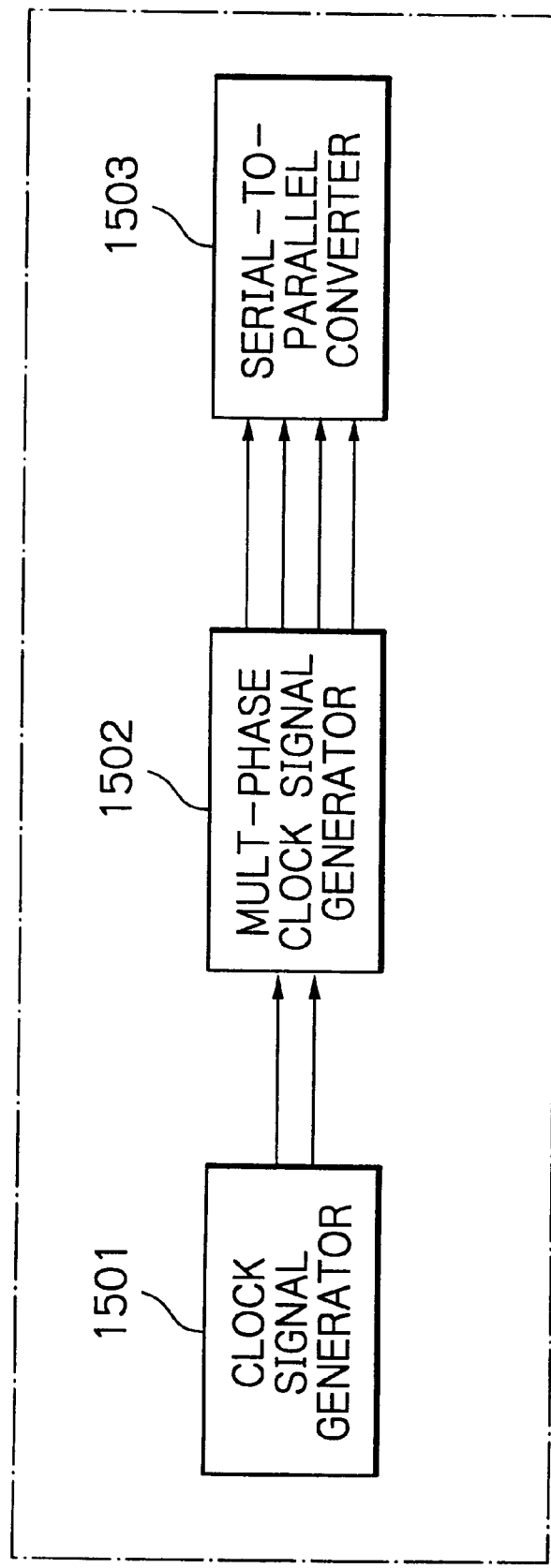
FIG. 15 is a block circuit diagram illustrating a serial-to-parallel converter apparatus to which the multi-phase clock signal generators of FIG. 12, 13 or 14 are applied.

The multi-phase clock signal generator of FIGS. 12, 13 and 14 is applied to an integrated circuit such as a serial-to-parallel converter apparatus as illustrated in FIG. 15. In FIG. 15, reference numeral 1501 designates a clock signal generator for generating two clock signals having an opposite phase to each other, 1502 designates a multi-phase clock signal generator such as the multi-phase clock signal generator of FIG. 12, 13 or 14, and 1503 designates a serial-to-parallel converter. In FIG. 15, multi-phase clock signals are generated in proximity to the serial-to-parallel converter, thus suppressing the skew between the multi-phase clock signals and the increase of the power consumption of the clock signal generator 1501. Note that, if the multi-phase clock signal generator 1502 is absent, the clock signal generator 1501 directly drives the multi-phase clock signals, which would increase the power consumption.

The phase interpolators of the above-described embodiments are well known, for example, in FIG. 4 of Michel Combes et al., "A portable Clock Multiplier Generator Using Digital CMOS Standard Cells", IEEE Journal of Solid-State Circuits, Vol. 31, No. 7, pp. 958–965, Jul. 1996 and FIG. 9 of Stefanos Sidiropoulos, "A Semidigital Dual Delay-Locked Loop", IEEE Journal of Solid-State Circuits, Vol. 32, No. 11, pp. 1683–1692, November 1997.

As explained hereinabove, according to the present invention, a phase difference signal generator can be realized without using a complex feedback control. Further, the decrease of amplitude of the phase difference signals can be suppressed.

What is claimed is:

1. A phase difference signal generator comprising:

a first delay circuit having a delay time of n where n is 2, 3, . . . and x is a definite value, said first delay circuit receiving a first input clock signal having a phase of 0° to generate a first phase difference signal;

at least one k-to-(n–k) weighted phase interpolator having a first input for receiving an output signal of said first delay circuit and a second input for receiving a second input clock signal having a phase of θ to generate an output signal having a phase of (n–k)x+kθ/n where k is 1,2, . . . , n–1; and at least one second delay circuit connected to said k-to-(n–k) weighted phase interpolator, said second delay circuit having a delay time of kx to generate a k-th phase difference signal.

2. The phase difference signal generator as set forth in claim 1, further comprising a third delay circuit connected to said first delay circuit, said third delay circuit having a delay time of said k-to-(n–k) weighted phase interpolator to delay said first phase difference signal.

3. A phase difference signal generator comprising:

a first delay circuit having a delay time of x where x is a definite value, said first delay circuit receiving a first input clock signal having a phase of 0° to generate a first phase difference signal having a phase of x;

a second delay circuit having a delay time of x, connected to said first delay circuit; and a 1-to-1 weighted phase interpolator having a first input for receiving an output signal of said second delay circuit and a second input for receiving a second input clock signal having a phase of θ to generate a second phase difference signal having a phase of x+θ/2.

4. The phase difference signal generator as set forth in claim 3, further comprising a third delay circuit connected to said first delay circuit, said third delay circuit having a delay time of said 1-to-1 weighted phase interpolator to delay said first phase difference signal.

5. A phase difference signal generator comprising:

a first delay circuit having a delay time of x where x is a definite value, said first delay circuit receiving an input clock signal having a phase of 0° to generate a first phase difference signal having a delay time of x;

a second delay circuit having a delay time of x, connected to said first delay circuit;

an inverter for receiving said input clock signal; and a 1-to-1 weighted phase interpolator having a first input for receiving an output signal of said second delay circuit and a second input for receiving an output signal of said inverter to generate a second phase difference signal having a phase of x+90°.

6. The phase difference signal generator as set forth in claim 5, further comprising a third delay circuit connected to said first delay circuit, said third delay circuit having a delay time of said 1-to-1 weighted phase interpolator to delay said first phase difference signal.

7. A multi-phase clock signal generator comprising:

a first phase difference signal generator for receiving first and second input clock signals having phases of 0° and 180°, respectively, to generate first and second output clock signals having phases of 0° x and 90°+x, respectively, where x is a definite value; and a second phase difference signal generator for receiving said second and first input clock signals to generate third and fourth output clock signals having phases of 180°+x and 270°+x, each of said first and second phase difference signal generators comprising:

a first delay circuit having a delay time of 2x for receiving one of said input clock signals to generate one of said first and third output clock signals a 1-to-1 weighted phase interpolator having a first input for receiving an output signal of said first delay circuit and a second input for receiving the other of said first and second input clock signals to generate an output signal having one phase of x+90° and 270°+x; and a second delay circuit connected to said 1-to-1 weighted phase interpolator, said second delay circuit having a delay time of x to generate one of said second and fourth output clock signals.

8. The phase difference signal generator as set forth in claim 7, wherein each of said first and second phase difference signal generators further comprises a third delay circuit connected to said first delay circuit, said third delay circuit having a delay time of said 1-to-1 weighted phase interpolator to delay the one of said first and third output clock signals.

9. A multi-phase clock signal generator comprising:

a first phase difference signal generator for receiving first and second input clock signals having phases of 0° and 180°, respectively, to generate first and second output clock signals having phases of 0°+x and 90°+x, respectively, where x is a definite value; and a second phase difference signal generator for receiving said second and first input clock signals to generate third and fourth output clock signals having phases of 180°+x and 270°+x, each of said first and second phase difference signal generators comprising:

a first delay circuit having a delay time of x to receive one of first and second input clock signals to generate one of said first and third output clock signals, a second delay circuit having a delay time of x, connected to said first delay circuit; and a 1-to-1 weighted phase interpolator having a first input for receiving an output signal of said second delay circuit and a second input for receiving the other of said first and second input clock signals to generate one of said second and fourth output clock signals.

10. The phase difference signal generator as set forth in claim 9, wherein each of said first and second phase difference signal generators further comprises a third delay circuit connected to said first delay circuit, said third delay circuit having a delay time of said 1-to-1 weighted phase interpolator to delay said first phase difference signal.

11. A multi-phase clock signal generator comprising n phase difference signal generator stages each including $2^n$ phase difference signal generators where n is 2, 3, . . . , each of two phase difference signal generators of a first one of said phase difference signal generator stages receiving two input clock signals having phases of 0° and 180°, respectively;

each of $2^k$ phase difference signal generators of a k-th one of said phase difference signal generator stages receiving two output signals of a (k–1)-th one of said phase difference signal generator stage where k is 2, 3, . . . , n, $2^n$ phase difference signal generators of an n-th one of said phase difference signal generator stages generating output clock signals having a phase of 360°/n with each other, each of said phase difference generators comprising:
first and second input terminals;
first and second output terminals;
a first delay circuit, connected between said first input terminal and said first output terminal, said first delay circuit having a delay time of x where x is a definite value;
a 1-to-1 weighted phase interpolator having a first input connected to said first delay circuit and a second input connected to said second input terminal; and
a second delay circuit connected between said 1-to-1 weighted phase interpolator and said second output terminal and having a delay time of x.

12. The multi-phase clock signal generator as set forth in claim 11, wherein said difference signal generator comprises a third delay circuit connected between said first delay circuit and said first output terminal, said third delay circuit having a delay time of said 1-to-1 weighted phase interpolator.

13. A multi-phase clock signal generator comprising n phase difference signal generator stages each including $2_n$ phase difference signal generators where n is 2, 3, . . . , each of two phase difference signal generators of a first one of said phase difference signal generator stages receiving two input clock signals having phases of 0° and 180°, respectively;

each of $2_k$ phase difference signal generators of a k-th one of said phase difference signal generator stages receiving two output signals of a (k−1)-th one of said phase difference signal generator stage where k is 2, 3, . . . ,n $2_n$ phase difference signal generators of an n-th one of said phase difference signal generator stages generating output clock signals having a phase of 360°/n with each other, each of said phase difference generators comprising:
first and second input terminals;
first and second output terminals;
a first delay circuit, connected between said first input terminal and said first output terminal, said first delay circuit having a delay time of x where x is a definite value;
a second delay circuit, connected to said first delay circuit, said second delay circuit having a delay time of x; and
a 1-to-1 weighted phase interpolator having a first input connected to said second delay circuit and a second input connected to said second input terminal.

14. The multi-phase clock signal generator as set forth in claim 13, wherein said difference signal generator comprises a third delay circuit connected between said first delay circuit and said first output terminal, said third delay circuit having a delay time of said 1-to-1 weighted phase interpolator.

* * * * *